(12) United States Patent
Lee

(10) Patent No.: US 9,425,760 B2
(45) Date of Patent: Aug. 23, 2016

(54) COMPOSITE ELECTRONIC COMPONENT, BOARD HAVING THE SAME MOUNTED THEREON, AND POWER SMOOTHING UNIT COMPRISING THE SAME

(71) Applicant: SAMSUNG ELECTRO-MECHANICS CO., LTD., Suwon-Si, Gyeonggi-Do (KR)

(72) Inventor: Jae Hoon Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 132 days.

(21) Appl. No.: 14/242,516

(22) Filed: Apr. 1, 2014

(65) Prior Publication Data

US 2014/0312990 A1    Oct. 23, 2014

(30) Foreign Application Priority Data

Apr. 19, 2013 (KR) .......................... 10-2013-0043760
Dec. 30, 2013 (KR) .......................... 10-2013-0167478

(51) Int. Cl.
*H03H 7/01* (2006.01)
*H03K 5/00* (2006.01)
*H03H 1/00* (2006.01)

(52) U.S. Cl.
CPC ........... *H03H 7/0115* (2013.01); *H03H 1/0007* (2013.01); *H03H 2001/0085* (2013.01)

(58) Field of Classification Search
CPC ... H03H 7/0138; H03H 7/0113; H03H 1/007; H03H 2001/0057; H03H 2001/0028
USPC ................... 333/181, 184–186; 327/552–559
See application file for complete search history.

(56) References Cited

U.S. PATENT DOCUMENTS 5,559,682 A    9/1996  Kanouda et al.
6,252,481 B1 *  6/2001  Iwao ..................... H01F 27/292
                                                          336/200

(Continued)

FOREIGN PATENT DOCUMENTS

CN           2096775 U      2/1992
CN         101651404 A      2/2010

(Continued)

OTHER PUBLICATIONS

Japanese Notice of Office Action issued in corresponding Japanese Patent Application No. 2014-066096, mailed on Mar. 31, 2015; 13 pages with English translation.

(Continued)

*Primary Examiner* — Dinh Le
(74) *Attorney, Agent, or Firm* — McDermott Will & Emery LLP

(57) ABSTRACT

A composite electronic component may include: an input terminal receiving power which has been converted by a power management unit; a power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, and smoothing power; and an output terminal supplying the smoothed power. The inductor may suppress an alternating current (AC) component of supplied power and the capacitor may reduce ripples in the supplied power.

26 Claims, 11 Drawing Sheets

(56) References Cited

U.S. PATENT DOCUMENTS

| | | | |
|---|---|---|---|
| 6,551,427 B2 * | 4/2003 | Sakamoto | C04B 35/053 156/289 |
| 8,981,890 B2 * | 3/2015 | An | H01F 3/14 257/531 |
| 2003/0030510 A1 | 2/2003 | Sasaki et al. | |
| 2004/0140877 A1 | 7/2004 | Nakao et al. | |
| 2010/0244807 A1 | 9/2010 | Xu et al. | |
| 2014/0313785 A1 * | 10/2014 | Lee | H02M 3/33507 363/21.01 |

FOREIGN PATENT DOCUMENTS

| | | |
|---|---|---|
| CN | 101777831 A | 7/2010 |
| JP | 02-142104 A | 5/1990 |
| JP | 06-209570 A | 7/1994 |
| JP | 2001-176728 A | 6/2001 |
| JP | 2002-222712 A | 8/2002 |
| JP | 2004-063676 A | 2/2004 |
| JP | 2004-194377 A | 7/2004 |
| JP | 2007-173713 A | 7/2007 |
| JP | 2007-234755 A | 9/2007 |
| JP | 2010-205905 A | 9/2010 |
| KR | 2003-0014586 A | 2/2003 |

OTHER PUBLICATIONS

Chinese Office Action issued in Chinese Application No. 201410138088.3, dated May 25, 2016, with English Translation.

* cited by examiner

COMPOSITE ELECTRONIC COMPONENT, BOARD HAVING THE SAME MOUNTED THEREON, AND POWER SMOOTHING UNIT COMPRISING THE SAME

CROSS-REFERENCE TO RELATED APPLICATION

This application claims the benefit of Korean Patent Application Nos. 10-2013-0043760 filed on Apr. 19, 2013, 10-2013-0167478 filed on Dec. 30, 2013 with the Korean Intellectual Property Office, the disclosure of which is incorporated herein by reference.

BACKGROUND

The present disclosure relates to a composite electronic component including a plurality of passive elements.

Recently, electronic devices have been miniaturized, while still requiring diverse functions to meet demand for products being lighter, thinner, shorter, and smaller while retaining high performance.

In order to meet various service requirements, electronic devices have a power semiconductor-based power management integrated circuit (PMIC) undertaking a function of effectively controlling and managing limited battery resources.

However, the provision of various functions in electronic devices leads to an increase in the number of DC/DC convertors provided in a PMIC and the number of passive elements required to be provided in a power input terminal and a power output terminal of a PMIC as well.

In this case, an area for disposing components of electronic devices is inevitably increased, posing an obstacle to the miniaturization of electronic devices.

In addition, wiring patterns of the PMIC and peripheral circuits thereof generate significant amounts of noise.

SUMMARY

An exemplary embodiment in the present disclosure may provide a composite electronic component having a reduced component mounting area in a driving power supply system.

An exemplary embodiment in the present disclosure may also provide a composite electronic component capable of restraining generation of noise in a driving power supply system.

According to an exemplary embodiment in the present disclosure, a composite electronic component may include: an input terminal receiving power which has been converted by a power management unit; a power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet (or a magnetic material), and smoothing power; and an output terminal supplying the smoothed power, wherein the inductor suppresses an alternating current (AC) component of supplied power and the capacitor reduces ripples in the supplied power.

A ratio of output power to input power input to the power smoothing unit (output power/input power) may be equal to or greater than 85%.

A frequency of power input to or output from the power smoothing unit may range from 1 MHz to 30 MHz.

Capacitance of the capacitor may range from 1 µF to 100 µF.

Inductance of the inductor may range from 0.01 µH to 1.1 µH.

A volume ratio of the magnet to the overall volume of the composite electronic component (volume of magnet/volume of composite electronic component) may range from 55% to 95%.

The input terminal may be formed in a portion of one end surface of the power smoothing unit.

A current of power input to or output from the power smoothing unit may range from 0.1 A to 10.0 A.

The composite electronic component may include a ground terminal unit connecting the power smoothing unit and a ground.

According to an exemplary embodiment in the present disclosure, a composite electronic component may include: a composite body including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, the capacitor and the inductor being integrally combined; an input terminal formed in a first end surface of the composite body and connected to a conductive pattern of the inductor; an output terminal formed in a second end surface of the composite body and connected to the conducive pattern of the inductor and an internal electrode of the capacitor; and a ground terminal formed in one or more of upper and lower surfaces and first and second lateral surfaces of the composite body and connected to the internal electrode of the capacitor, wherein the inductor and the capacitor are connected in series, the inductor suppresses an alternating current (AC) component of supplied power, and the capacitor reduces ripples in the supplied power.

The magnetic body may be formed by stacking a plurality of magnetic layers each having a conductive pattern formed thereon, and the conductive patterns may constitute the coil part.

The inductor may be a thin film-type inductor in which the magnetic body includes an insulating substrate and a coil formed in at least one surface of the insulating substrate.

The magnetic body may include a core and a coil wound around the core.

A ratio (output power/input power) of output power to input power input to the composite body may be equal to or greater than 85%.

A frequency of power input to or output from the composite body may range from 1 MHz to 30 MHz.

Capacitance of the capacitor may range from 1 µF to 100 µF.

Inductance of the inductor may range from 0.01 µH to 1.1 µH.

A volume ratio of the magnet to the overall volume of the composite body (volume of magnet/volume of composite electronic component) may range from 55% to 95%.

The input terminal may be formed in a portion of one end surface of the composite body.

A current of power input to or output from the composite body may range from 0.1 A to 10.0 A.

The internal electrode may include a first internal electrode having a lead exposed to one or more of the first and second lateral surfaces of the composite body and a second internal electrode having a lead exposed to the second end surface of the composite body.

The inductor may be disposed on an upper portion of the capacitor.

The capacitor may be disposed on a lateral surface of the inductor.

According to an exemplary embodiment in the present disclosure, a composite electronic component, as a power smoothing electronic component used in a power source terminal of a portable mobile device, suppressing an AC component of supplied power, and reducing ripples, may include: a power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, the capacitor and the inductor being integrally combined; an input terminal formed on one end surface of the power smoothing unit and receiving power which has been converted by a power management unit; and an output terminal formed on one end surface of the power smoothing unit and supplying power which has been smoothed by the power smoothing unit, wherein the inductor may suppress an AC component of the supplied power and the capacitor may reduce ripples in the supplied power.

According to an exemplary embodiment in the present disclosure, a board having a composite electronic component mounted thereon may include: a printed circuit board (PCB) having an electrode pad formed thereon; the composite electronic component installed on the PCB; and solder connecting the electrode pad and the composite electronic component.

According to an exemplary embodiment in the present disclosure, a power smoothing unit may include: a battery; a first power smoothing unit smoothing power supplied from the battery; a power management unit converting power provided from the first power smoothing unit through a switching operation; and a second power smoothing unit smoothing power provided from the power management unit, wherein the second power smoothing unit is a composite electronic component including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, wherein the inductor suppresses an alternating current (AC) component of the supplied power and the capacitor reduces ripples in the supplied power.

The power management unit may include: a transformer in which primary and secondary sides are insulated from one another; a switch unit positioned in the primary side of the transformer and switching power provided from the first power smoothing unit; a pulse width modulation (PWM) integrated circuit (IC) controlling a switching operation of the switch unit; and a rectifying unit positioned in the secondary side of the transformer and rectifying the converted power.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
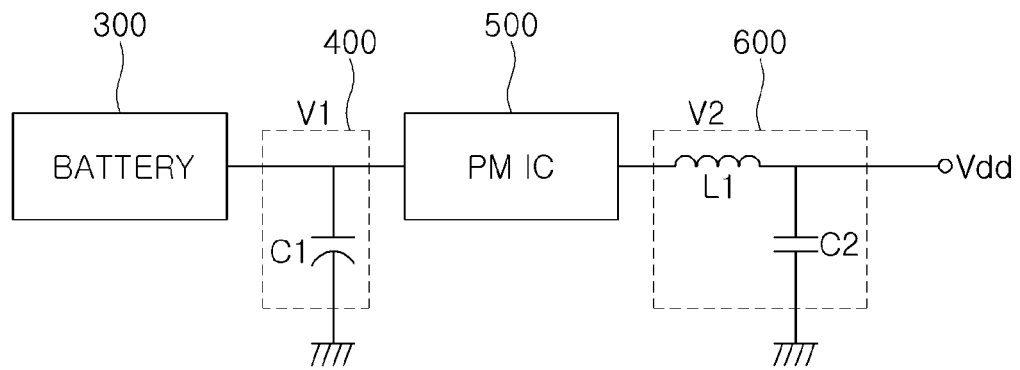
FIG. 1 is a view illustrating a driving power supply system supplying driving power through a battery and a power management unit to a predetermined terminal requiring driving power according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

A composite electronic component according to an exemplary embodiment of the present disclosure may include an input terminal receiving power which has been converted by a power management unit; a power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet (or a magnetic material), and smoothing power; and an output terminal supplying the smoothed power, wherein the inductor suppresses an alternating current (AC) component of supplied power and the capacitor reduces ripples in the supplied power.

The composite electronic component according to an exemplary embodiment of the present disclosure refers to a composite electronic component in which an inductor and a capacitor, among a plurality of inductors and capacitors connected to a power management unit (for example, a power management integrated circuit (PMIC)) to smooth power, are combined (or integrated) as a single component.

In the exemplary embodiment of the present disclosure, an inductor and a capacitor of a second power smoothing unit smoothing power converted by the PMIC upon receiving it are formed as a single composite component, but the present disclosure is not limited thereto and a plurality of components connected to the PMIC may be implemented as a single composite form.

Thus, although the composite electronic component is a component in which the inductor and the capacitor connected to the PMIC are combined, it may also be applied as an array-type composite component by combining a plurality of inductors and capacitors.

The composite electronic component may include an input terminal receiving power which has been converted by the PMIC and a power smoothing unit smoothing the power and including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet.

As described above, the composite electronic component, a power component connected to the PMIC, is different from a general composite component in which an inductor and a capacitor for a high frequency filter are combined in various aspects such as design, manufacturing process, and the like, due to differences in materials, capacity, and the like, as described hereinbelow.

Hereinafter, the composite electronic component according to an exemplary embodiment of the present disclosure will be described in detail.

A ratio (output power/input power) of output power to input power input to the power smoothing unit is equal to or greater than 85%.

As mentioned above, the power smoothing unit serves to receive power having a voltage converted by the PMIC and smooth the same, and in case of a mobile device, in order to supply power for a longer period of time with limited battery capacity, a ratio of output power to supplied input power, namely, power efficiency, needs to be equal to or greater than 85%.

Namely, unlike a general composite component in which an inductor and a capacitor for a high frequency filter are combined, an inductor of the composite electronic component according to the exemplary embodiment of the present disclosure is a power inductor having inductance ranging from 0.01 µH to 1.1 µH, and a capacitor is a high capacity component having capacitance ranging from 1 µF to 100 µF, whereby efficiency of input and output power may be equal to or greater than 85%.

A frequency of power input to or output from the power smoothing unit may range from 1 MHz to 30 MHz.

As a switching frequency of power input to or output from the power smoothing unit is low, an inductor having high inductance characteristics for a high current is required, and as the switching frequency is high, an inductor having relatively low inductance characteristics for a high current is required.

The inductor for a high current used in a high frequency band and having relatively low inductance characteristics is advantageous for a small inductor product, but it has low power efficiency due to power loss due to switching resistance.

Thus, in the exemplary embodiment of the present disclosure, a switching frequency in a low frequency band ranging from approximately 1 MHz to 30 MHz is used.

A general composite component in which an inductor and a capacitor for a high frequency filter are combined is a component used in a signal line, which is used in a high frequency region higher than or equal to 100 MHz or 1 GHz. In contrast, the composite electronic component according to the exemplary embodiment of the present disclosure is a component used in a power line. The composite electronic component, employing frequency band ranging from 1 MHz to 30 MHz, may be used in a low frequency region.

The capacitor may have capacitance ranging from, for example 1 µF to 100 µF, but the present disclosure is not limited thereto.

Namely, the capacitor included in the composite electronic component according to the exemplary embodiment of the present disclosure is a high capacity product having capacitance ranging from 1 µF to 100 µF to remove ripples in supplied power.

The inductor may have inductance ranging, for example, from 1 µH to 1.1 µH, but the present disclosure is not limited thereto.

It is important for portable mobile devices to be small and lightweight and have a long battery lifetime.

In a technical aspect of manufacturing compact portable mobile devices, reducing switching loss resistance in DC-DC is crucial.

Namely, reducing switching loss resistance in DC-DC improves efficiency, increasing a clock speed, and the increase in a clock speed may reduce inductance of the inductor, and the reduction in inductance may reduce the number of turns of a coil within the inductor, and thus, the inductor may be miniaturized.

Namely, upon receiving power converted by the PMIC, the inductor included in the composite electronic component according to the exemplary embodiment of the present disclosure serves to suppress a low frequency alternating current (AC) component included in the power, so the inductor is a product having high inductance ranging from 0.01 µH to 1.1 µH, and in particular, it is a power inductor product.

According to the exemplary embodiment of the present disclosure, the inductor is a compact product having high inductance ranging from 0.01 µH to 1.1 µH, and thus, it may be combined with the capacitor, while having high efficiency characteristics in a low frequency region having a switching frequency ranging from 1 MHz to 30 MHz, thus implementing a composite electronic component.

In the composite electronic component, if inductance of the inductor is less than 0.01 µH, ripples of power are increased to cause a problem.

Meanwhile, in a case in which inductance of the small inductor used in a portable mobile device exceeds 1.1 µH, if the number of turns of a coil is increased to implement the inductance, DC resistance Rdc is relatively increased and DC-bias characteristics are degraded, lowering efficiency.

Thus, in the composite electronic component according to the exemplary embodiment of the present disclosure, the inductor has inductance ranging from 0.01 µH to 1.1 µH.

Meanwhile, according to the exemplary embodiment of the present disclosure, the inductor of the composite electronic component includes a magnetic body including a coil part and a magnet.

In the case of the general composite component including an inductor and capacitor for a high frequency filter the inductor is formed to include a dielectric layer and a conductive pattern formed on the dielectric layer and aims at implementing high impedance. In contrast, the inductor of the composite electronic component according to the exemplary embodiment of the present disclosure aims at high impedance, so it may include a magnetic body including a coil part and a magnet.

Thus, since the inductor according to the exemplary embodiment of the present disclosure includes the magnetic body including a coil part and a magnet, high inductance effect may be obtained.

A volume ratio of the magnet to the overall volume of the composite electronic component (volume of magnet/volume of composite electronic component) may range from 55% to 95%.

By adjusting the ratio of the magnet to the overall volume of the composite electronic component (volume of magnet/volume of composite electronic component) to satisfy the range from 55% to 95%. Effects of high DC-bias characteristics, low DC resistance Rdc, and reduction of ripples may be obtained.

If the volume ratio of the magnet to the overall volume of the composite electronic component (volume of magnet/volume of composite electronic component) is less than 55%, it may be difficult to implement an inductor having high inductance characteristics for a high current, namely, high DC bias characteristics and low DC resistance Rdc characteristics, required when used in the low frequency band having a switching frequency ranging from 1 MHz to 30 MHz.

If the volume ratio of the magnet to the overall volume of the composite electronic component (volume of magnet/volume of composite electronic component) exceeds 95%, capacitance and performance of the capacitor may be degraded and be problematic in reducing ripples.

The input terminal may be formed in a portion of one end surface of the power smoothing unit.

According to the exemplary embodiment of the present disclosure, the input terminal may be formed in a portion of one end of the power smoothing unit to prevent a degradation of self-resonant frequency (SRF) of the inductor.

In the composite electronic component in which the inductor and the capacitor are combined according to the exemplary embodiment of the present disclosure, in the case in which the input terminal is formed in a portion of one end surface of the power smoothing unit, parasitic capacitance may be generated in the input terminal, the coil part of the inductor, an internal electrode of the capacitor, or between the coil part of the inductor and the internal electrode of the capacitor.

Due to the parasitic capacitance, the self-resonant frequency (SRF) of the inductor may move toward a low frequency.

In the case in which the self-resonant frequency (SRF) is shifted toward a low frequency, a frequency region of the inductor that may be used in the exemplary embodiment of the present disclosure may be narrowed.

Namely, a function of the inductor may not be executed in a high frequency region higher than the self-resonant frequency (SRF), so, if the SRF is shifted toward a low frequency, an available frequency region may be limited.

However, in the exemplary embodiment of the present disclosure, since the input terminal is formed in a portion of one end surface of the power smoothing unit, an area of the input terminal is so small that generation of parasitic capacitance between the coil part of the inductor and the internal electrode of the capacitor may be minimized to prevent a change in the SRF.

In the composite electronic component according to the exemplary embodiment of the present disclosure, the input terminal is formed in a portion of one end surface of the power smoothing unit, but the present disclosure is not limited thereto and the input terminal may be formed in the entirety of the one end.

A current of power input to or output from the power smoothing unit may range from 0.1 A to 10.0 A.

Unlike the general composite component of an inductor and a capacitor for high frequency, the composite electronic component according to the exemplary embodiment of the present disclosure is used for a low frequency, and the current of power input or output from the power smoothing unit may range from 0.1 A to 10.0 A, but the present disclosure is not limited thereto.

Meanwhile, according to the exemplary embodiment of the present disclosure, the composite electronic component has a configuration in which the inductor and the capacitor are combined, and here, a degree of area matching between combined surfaces of the inductor and the capacitor may be greater than or equal to 95%.

The degree of area matching between the combined surfaces of the inductor and the capacitor refers to a degree by which the areas of respective components are consistent, on the assumption that a case in which the areas of the combined surfaces of the respective components is 100.

Since the areas of the combined surfaces of the inductor and the capacitor are matched by 95% or more, a defect rate may be minimized when the composite electronic component is mounted on a board.

In detail, the composite electronic component is mounted on a board by a vacuum facility, and by adjusting the areas of the combined surfaces of the inductor and the capacitor to be matched by 95% or more, a defect rate may be minimized when the composite electronic component is mounted on a board.

If the degree by which the combined surfaces of the inductor and the capacitor are consistent is less than 95%, a vacuum may not be evenly applied to the entirety of the component electronic component when the composite electronic component is mounted on a board, and in this case, the component electronic component may not be properly mounted, may collapse when mounted, or the like.

Hereinafter, the component electronic component according the exemplary embodiment of the present disclosure will be described in more detail with reference to the accompanying drawings.

FIG. 1 is a view illustrating a driving power supply system supplying driving power through a battery and a power management unit to a predetermined terminal requiring driving power according to an exemplary embodiment of the present disclosure.

Referring to FIG. 1, the driving power supply system includes a battery 300, a first power smoothing unit 400, a power management unit 500, and a second power smoothing unit 600.

The battery 300 serves to supply power to the power management unit 500. Here, it is assumed that power supplied by the battery 300 to the power management unit 500 is first power.

The first power smoothing unit 400 may smooth the first power V1 and supply the smoothed first power to the power management unit 500. In detail, the first power smoothing unit 400 may include a capacitor C1 formed between connection terminals of the battery 300 and the power management unit 500 and a ground. The capacitor C1 may reduce ripples included in the first power.

Also, the capacitor C1 may charge electric charges. In a case in which the power management unit 500 instantaneously consumes a high current, the capacitor C1 may discharge charged electric charges to suppress voltage fluctuations of the power management unit 500.

The capacitor C1 may be a capacitor having high capacitance and including 300 or more dielectric layers.

The power management unit 500 serves to convert power introduced to an electronic device into a form fitting the electronic device, and distribute, charge, and control power. Thus, in general, the power management unit 500 may include a DC/DC converter.

Also, the PMIC 500 may be implemented as a power management integrated circuit (PMIC).

The power management unit 500 may convert the first power V1 into second power V2. The second power V2 is power requested by an active element such as an IC, or the like, that is connected to an output terminal of the power management unit 500 to receive driving power.

The second power smoothing unit 600 may smooth the second power V2 and deliver the smoothed second power to an output terminal Vdd. An active element such as IC, or the like, that is provided with driving power from the power management unit 500 may be connected to the output terminal Vdd.

In detail, the second power smoothing unit 600 includes an inductor L1 connected in series between the power management unit 500 and the output terminal Vdd. Also, the second power smoothing unit 600 includes a capacitor C2 formed between connection terminals of the power management unit 500 and the output terminal Vdd and a ground.

The second power smoothing unit 600 may suppress an AC component included in the second power V2 and reduces ripples in supplied power.

Also, the second power smoothing unit 600 may stably supply power to the output terminal Vdd.

The inductor L1 may be a power inductor applicable to a high current.

The power inductor is an efficient inductor whose inductance is changed less than that of a general inductor when a DC is applied thereto. Namely, the power inductor may be considered an inductor having even DC bias characteristics (a change in inductance when a DC is applied) in addition to a function of a general inductor.

Namely, the composite electronic component according to the exemplary embodiment of the present disclosure may include an efficient power inductor whose inductance is rarely changed when a DC is applied thereto, rather than a general inductor.

Also, the capacitor C2 may be a capacitor having high capacitance.

Figure 2A:
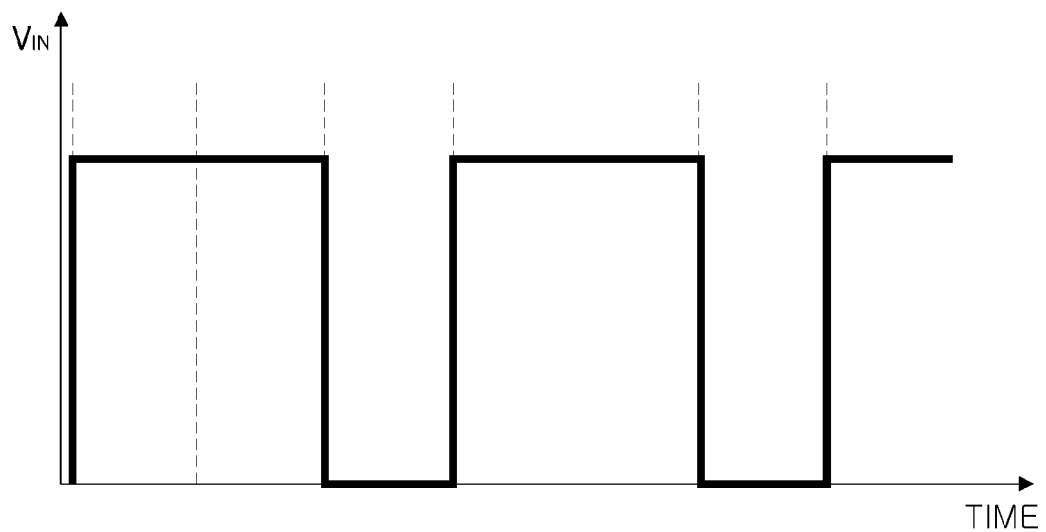
FIG. 2A is a graph illustrating a waveform of a source voltage output from the power management unit.

FIG. 2A is a graph illustrating a waveform of a source voltage output from the power management unit 500.

Figure 2B:
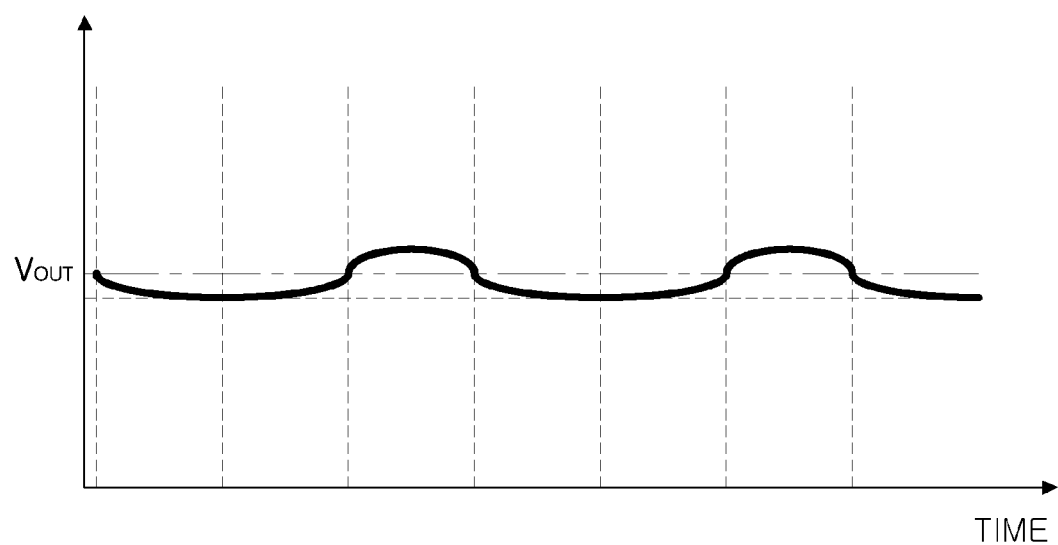
FIG. 2B is a graph illustrating a waveform of a current after power output from the power management unit passes through a power inductor.

FIG. 2B is a graph illustrating a waveform of a current after power output from the power management unit 500 passes through a power inductor L1.

Figure 2C:
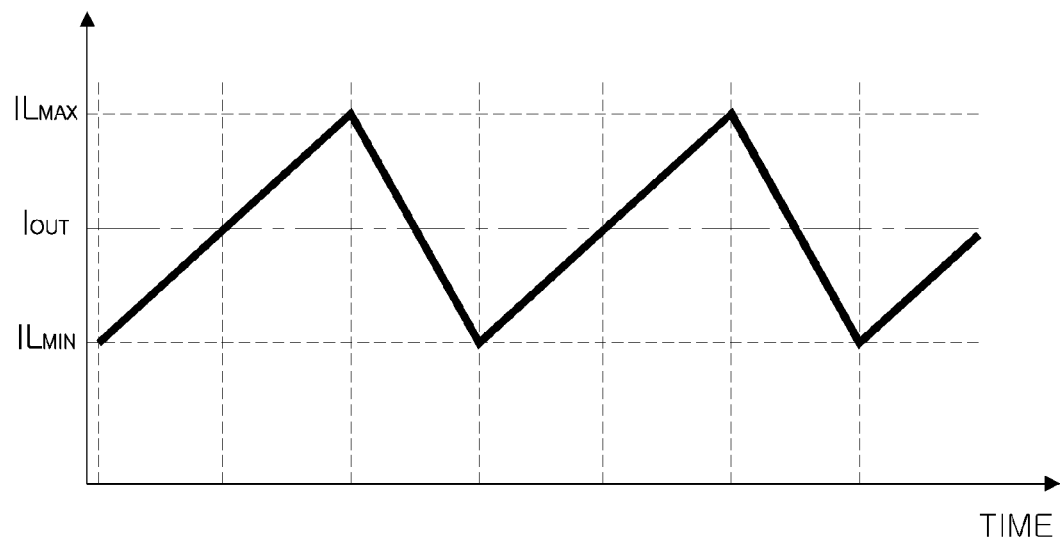
FIG. 2C is a graph illustrating a waveform of a voltage after power, having passed through the power inductor, passes through a second capacitor.

FIG. 2C is a graph illustrating a waveform of a voltage after power, having passed through the power inductor L1, passes through the second capacitor C2.

Referring to FIGS. 1 and 2A, the power management unit 500 may convert the first voltage V1 input through the first power smoothing unit 400, into the second voltage V2.

For example, the first power smoothing unit 400 may reduce ripples of a voltage applied by the battery 300 and supplies a DC first voltage V1 to the power management unit 500.

The power management unit 500 may receive the DC first voltage V1 input through the first power smoothing unit 400, and convert the received DC first voltage into a second voltage V2. Here, referring to FIG. 2A, the second voltage V2 may be a pulse width modulation (PWM) voltage (AC voltage). Thereafter, the power management unit 500 may provide the second voltage V2 to the second power smoothing unit 600.

The second power smoothing unit 600 may include the power inductor L1 including a magnetic body including a coil part and the second capacitor C2 including a ceramic body in which a plurality of dielectric layers and internal electrodes are stacked such that the internal electrodes are disposed to face each other with the dielectric layer interposed therebetween. Also, the second power smoothing unit 600 may suppress an AC component of the second voltage V2 provided from the power management unit 500, and reduce ripples.

Namely, the power inductor L1 may suppress an AC component of the second voltage V2 and the second capacitor C2 may reduce ripples of the second voltage V2.

Referring to FIG. 2B, after the second voltage V2, a PWM voltage, passes through the power inductor L1, the AC component thereof may be suppressed. Thus, a waveform of the second voltage V2 illustrated in FIG. 2A may be changed into the form illustrated in FIG. 2B.

Referring to FIG. 2C, after having passed through the power inductor L1, when the second voltage V2 passes through the second capacitor C2, ripples thereof may be reduced. Thus, the current waveform of the second voltage V2 illustrated in FIG. 2B may be changed into the voltage form illustrated in FIG. 2C. Here, in order to effectively reduce ripples of the second voltage V2, capacitance of the second capacitor C2 may range from 1 μF to 100 μF. Namely, the second capacitor C2 is a capacitor having high capacitance.

Thus, since the composite electronic component according to the exemplary embodiment of the present disclosure includes the second power smoothing unit 600 having the power inductor L1 suppressing an AC component of the second voltage V2 and the second capacitor C2 reducing ripples of the second voltage V2, a ratio of output power to input power input to the second power smoothing unit 600 may be greater than or equal to 85%.

Figure 3:
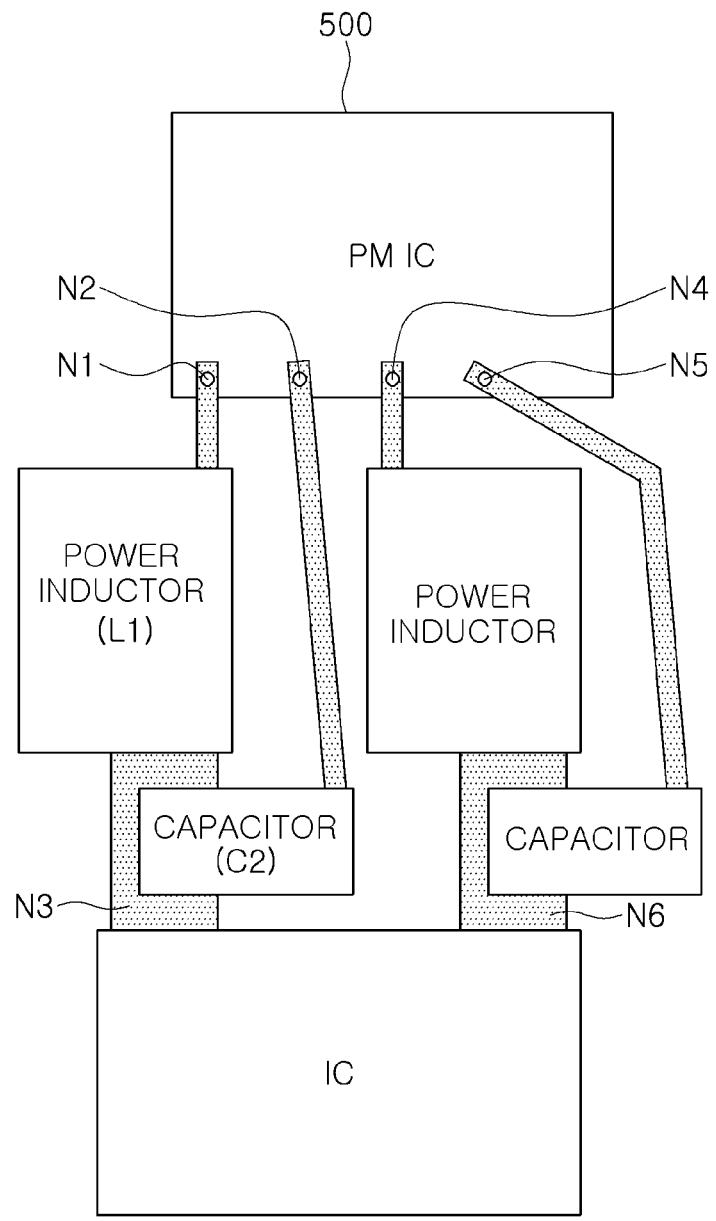
FIG. 3 is a view illustrating a layout pattern of the driving power supply system.

FIG. 3 is a view illustrating a layout pattern of the driving power supply system.

Referring to FIG. 3, a layout pattern of the power management unit 500, the power inductor L, and the second capacitor C2 may be recognized.

Ten DC/DC converters may be provided. Also, in order to implement functions of the DC/DC converters, each of the DC/DC converters require a power inductor and a high capacity capacitor (i.e., a capacitor having high capacitance).

Referring to FIG. 3, the power management unit 500 may include predetermined terminals N1 and N2. The power management unit 500 may receive power from the battery and convert the power by using the DC/DC converters. Also, the power management unit 500 may supply power converted through the first terminal N1. The second terminal N2 is a ground terminal.

Here, the first power inductor and the second capacitor C2 may receive power from the first terminal N1, smooth the received power, and supplies driving power through the third terminal N3, whereby the function of the second power smoothing unit may be performed.

Fourth to sixth terminals N4 to N6 illustrated in FIG. 3 perform functions identical to those of the first to third terminals N1 to N3, so detailed description thereof will be omitted.

To be considered important in designing a pattern of the driving power supply system is that the power management unit, the power conductor, and the high capacity capacitor need to be disposed as close as possible. Also, wiring of a power line needs to be designed to be short and thick.

This is due to the fact that a component layout area may be reduced and noise generation may be suppressed when such requirements are met.

In a case in which the number of output terminals of the power management unit 500 is small, there is no problem in disposing the power inductor and the high capacity capacitor to be close. However, if several outputs of the power management unit 500 are to be used, the power inductor and the high capacity capacitor may not be normally disposed due to component compactness. Also, the power inductor and the high capacity capacitor may be disposed in a non-optimized state according to priority of power.

For example, since the power inductor and the high capacity capacitor have a large size, a power line and a signal line may inevitably be lengthened when elements are actually disposed.

In the state in which the power inductor and the high capacity capacitor are disposed in a non-optimized state, intervals between respective elements and power lines are lengthened, generating noise which may negatively affect the power supply system.

Figure 4:
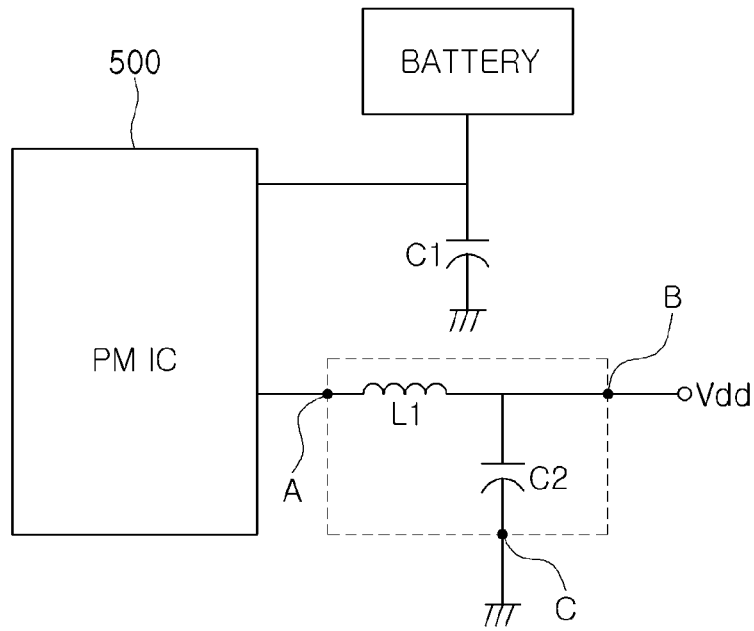
FIG. 4 is a circuit diagram of a composite electronic component according to an exemplary embodiment of the present disclosure.

FIG. 4 is a circuit diagram of a composite electronic component according to an exemplary embodiment of the present disclosure.

Referring to FIG. 4, a composite electronic component 700 includes an input terminal A, a power smoothing unit, an output terminal B, and a ground terminal C.

The power smoothing unit includes a power inductor L1 and a second capacitor C2.

The composite electronic component 700 may be an element serving as the second power smoothing unit as described above.

The input terminal A may receive power which has been converted by the power management unit 500.

The power smoothing unit may smooth power received through the input terminal A.

The output terminal B may supply smoothed power to the output terminal Vdd.

The ground terminal C may connect the power smoothing unit to a ground.

Meanwhile, the power smoothing unit includes the power inductor L1 connected between the input terminal A and the output terminal B and the second capacitor C2 connected between the ground terminal C and the output terminal B.

Referring to FIG. 4, since the power inductor L1 and the second capacitor C2 share the output terminal B, a space between the power inductor L1 and the capacitor C2 may be reduced.

In this manner, in the composite electronic component 700, the power inductor and the high capacity capacitor provided in an output power terminal of the power management unit 500 are implemented as a single component. Thus, the composite electronic component 700 has enhanced element integration.

Figure 5:
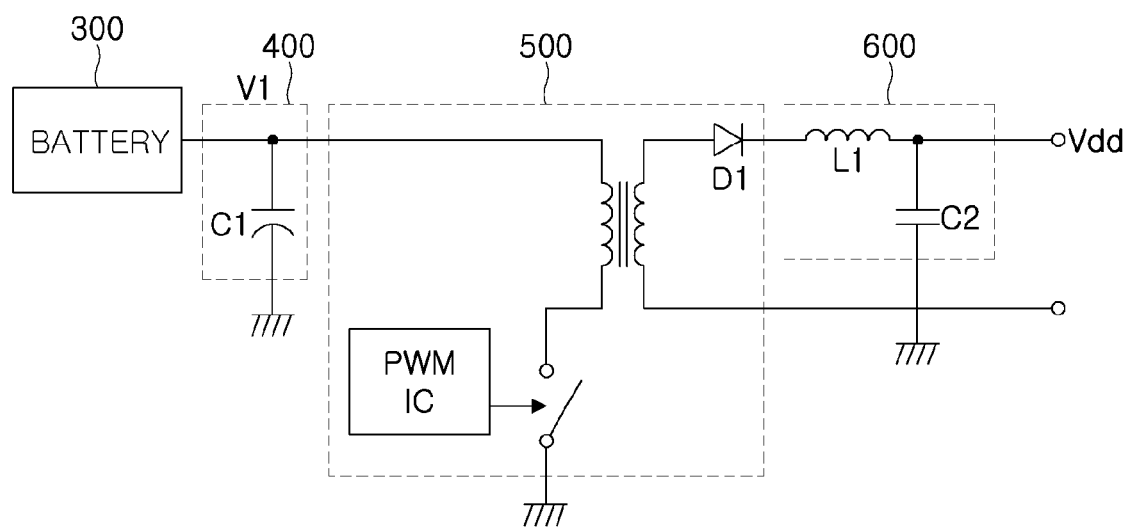
FIG. 5 is a detailed circuit diagram of a power smoothing unit including a composite electronic component according to an exemplary embodiment of the present disclosure.

FIG. 5 is a detailed circuit diagram of a power smoothing unit including a composite electronic component according to an exemplary embodiment of the present disclosure.

Referring to FIG. 5, a power smoothing unit including a component electronic component according to the exemplary embodiment of the present disclosure may include a battery 300, a first power smoothing unit 400 smoothing power supplied from the battery 300, a power management unit 500 converting power provided from the first power smoothing unit 400 through a switching operation, and a second power smoothing unit 600 smoothing power provided from the power management unit 500.

The power management unit 500 may include a transformer in which primary and secondary sides are insulated from one another, a switch unit positioned in the primary side of the transformer and switching power provided from the first power smoothing unit 400, a pulse width modulation (PWM) integrated circuit (IC) controlling a switching operation of the switch unit; and a rectifying unit positioned in the secondary side of the transformer and rectifying the converted power.

Namely, the power management unit 500 may convert power, for example, a first voltage V1, provided from the first power smoothing unit 400, into a second voltage V2 through a switching operation of the switch unit. Here, the PWM IC of the power management unit 500 may control the switching operation of the switch unit to convert the first voltage V1 into the second voltage V2.

Thereafter, the second voltage V2 may be rectified by the rectifying unit, for example, by a diode element D1, so as to be provided to the second power smoothing unit 600.

The second power smoothing unit 600 may be a composite electronic component including the capacitor C2 including a ceramic body in which a plurality of dielectric layers and internal electrodes are stacked such that the internal electrodes are disposed to face each other with the dielectric layer interposed therebetween and the inductor L1 including a magnetic body including a coil part and a magnet. The inductor L1 may suppress an AC component of the supplied second voltage V2, and the capacitor C1 may reduce ripples of the supplied second voltage V2.

Figure 6A:
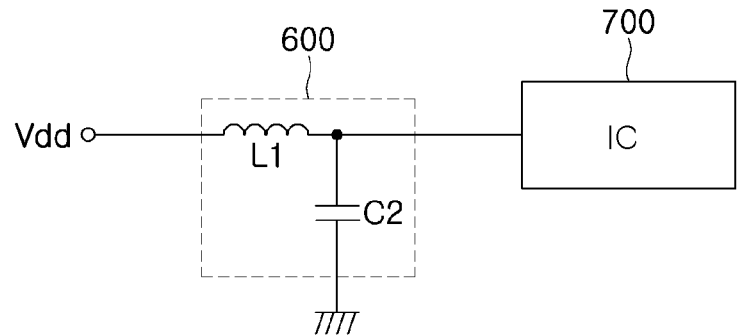
FIG. 6A is a circuit diagram of a composite electronic component according to another exemplary embodiment of the present disclosure.

FIG. 6A is a circuit diagram of a composite electronic component according to another exemplary embodiment of the present disclosure.

Figure 6B:
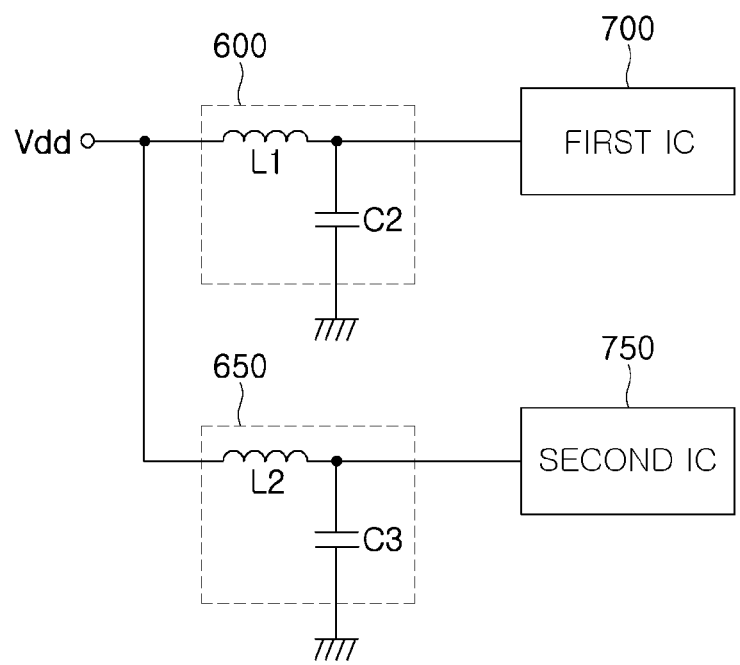
FIG. 6B is a circuit diagram of a composite electronic component according to another exemplary embodiment of the present disclosure.

FIG. 6B is a circuit diagram of a composite electronic component according to another exemplary embodiment of the present disclosure. Referring to FIG. 6B, in a case in which a plurality of integrated circuits (ICs) 700 and 750 are provided, a plurality of second power smoothing units 600 and 650 may be positioned on the input sides of the first and second ICs 700 and 750.

Figure 7:
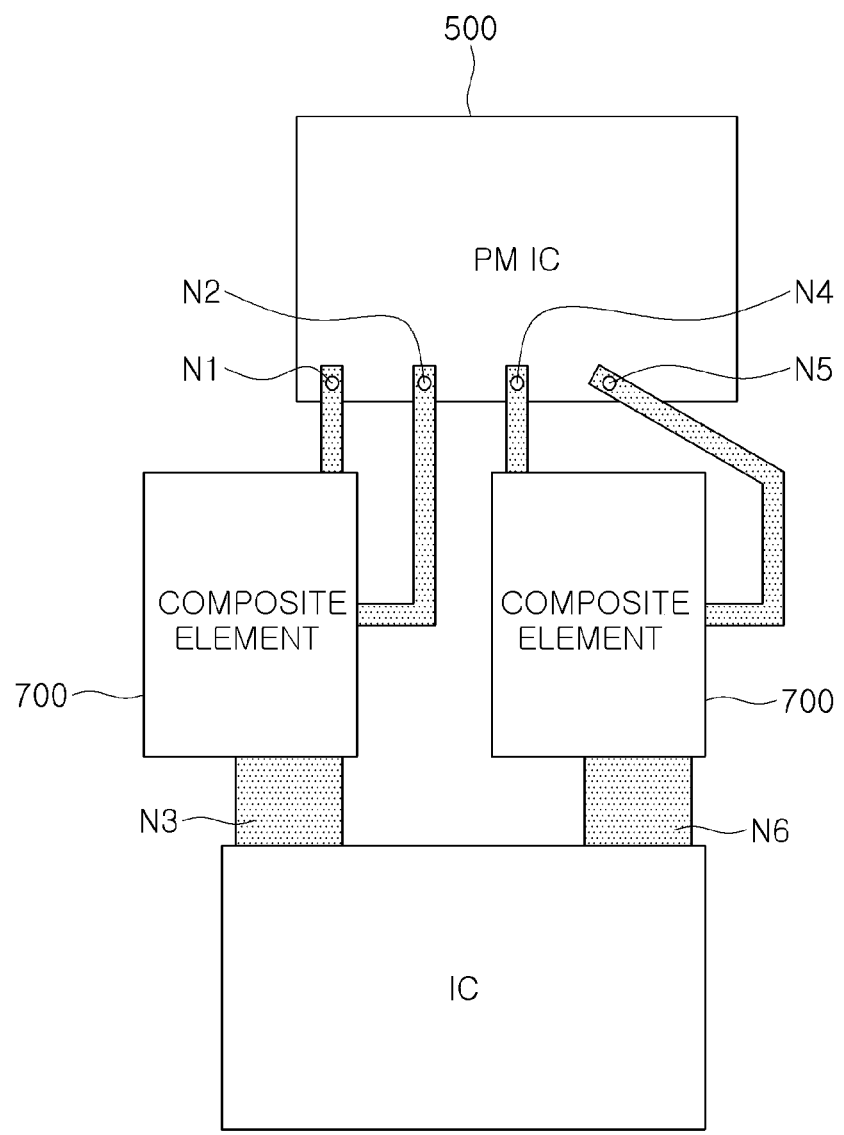
FIG. 7 is a view illustrating a layout pattern of a driving power supply system employing a composite electronic component according to an exemplary embodiment of the present disclosure.

FIG. 7 is a view illustrating a layout pattern of a driving power supply system employing a composite electronic component according to an exemplary embodiment of the present disclosure.

Referring to FIG. 7, it can be seen that the second capacitor C2 and the power inductor L1 are replaced with a composite electronic component according to the exemplary embodiment of the present disclosure.

As discussed above, the composite electronic component may serve as the second power smoothing unit.

Also, by replacing the second capacitor C1 and the power inductor L1 with the composite electronic component according to the exemplary embodiment of the present disclosure, a length of wiring may be minimized. Also, since the number of disposed elements is reduced, elements may be optimally disposed.

Namely, according to the exemplary embodiment of the present disclosure, the power management unit, the power inductor, and the high capacity capacitor may be disposed as close as possible, and since wirings of power lines are designed to be short and thick, noise may be reduced.

Meanwhile, electronic device manufacturers have strived to reduce a size of PCBs provided in electronic devices to meet consumer demand. Thus, it is required to enhance a degree of integration of ICs mounted on PCBs. In the exemplary embodiment of the present disclosure, since a plurality of elements are combined as a single composite component, like the composite electronic component, such demand may be satisfied.

Also, according to the exemplary embodiment of the present disclosure, since two components (second capacitor and power inductor) are implemented as a single composite electronic component, a PCB mounting area may be reduced. According to the exemplary embodiment of the present disclosure, a mounting area may be reduced by approximately 10% to 30% over an existing layout pattern.

Also, according to the exemplary embodiment of the present disclosure, the power management unit 500 may supply power to an IC to receive driving power, by a shortest wiring.

Composite Electronic Component

Hereinafter, exemplary embodiments of the present disclosure will be described with reference to the accompanying drawings.

To clarify exemplary embodiment of the present disclosure, directions of a hexahedron may be defined such that L, W, and T are a length direction, a width direction, and a thickness direction, respectively, in the drawings.

Figure 8:
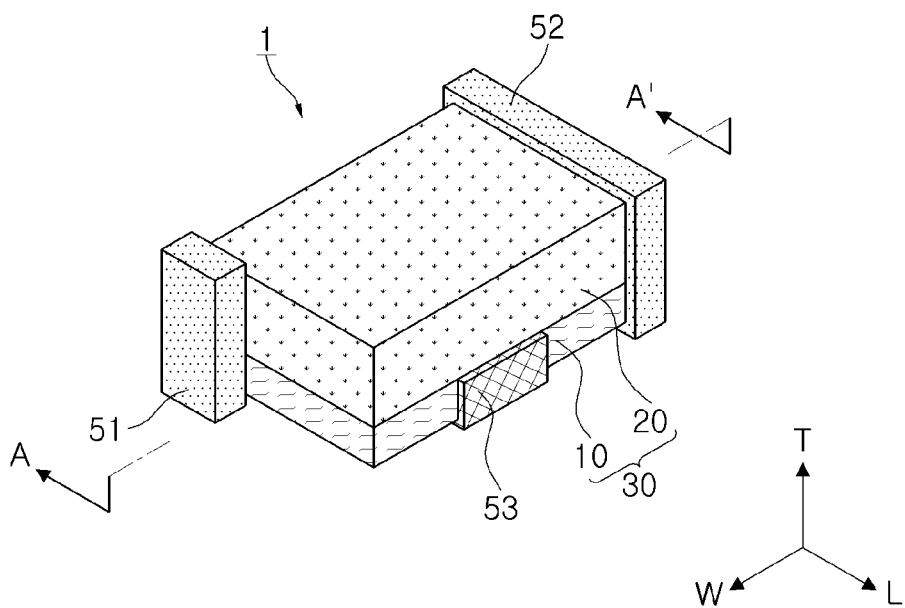
FIG. 8 is a perspective view schematically illustrating a composite electronic component according to an exemplary embodiment of the present disclosure.

FIG. 8 is a perspective view schematically illustrating a composite electronic component according to an exemplary embodiment of the present disclosure.

Figure 9:
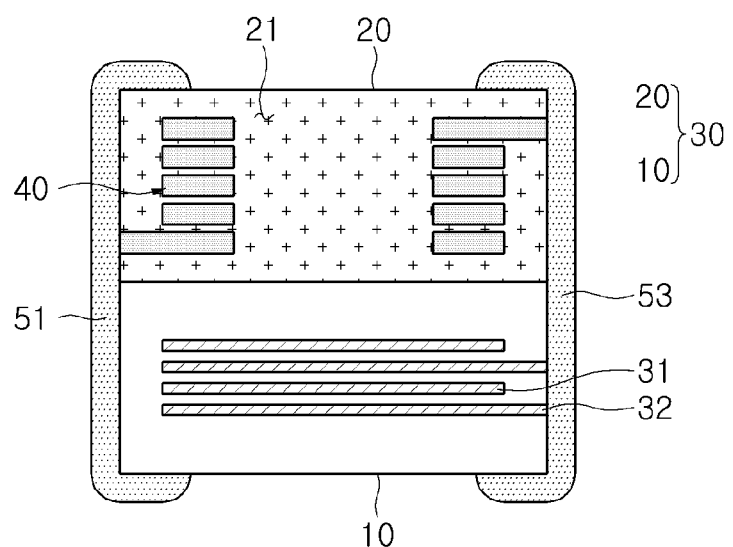
FIG. 9 is a cross-sectional view illustrating a first example of the composite electronic component of FIG. 8 taken along line A-A'.

FIG. 9 is a cross-sectional view illustrating a first example of the composite electronic component of FIG. 8 taken along line A-A'.

Figure 10:
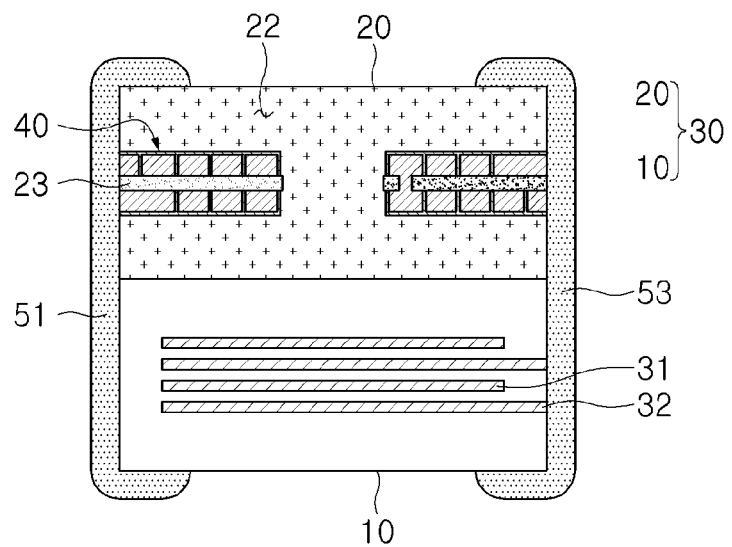
FIG. 10 is a cross-sectional view illustrating a second example of the composite electronic component of FIG. 8 taken along line A-A'.

FIG. 10 is a cross-sectional view illustrating a second example of the composite electronic component of FIG. 8 taken along line A-A'.

Figure 11:
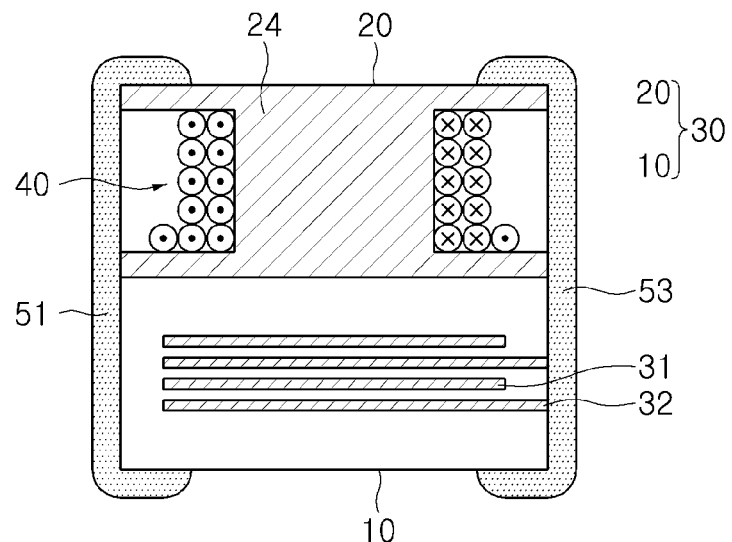
FIG. 11 is a cross-sectional view illustrating a third example of the composite electronic component of FIG. 8 taken along line A-A'.

FIG. 11 is a cross-sectional view illustrating a third example of the composite electronic component of FIG. 8 taken along line A-A'.

Figure 12:
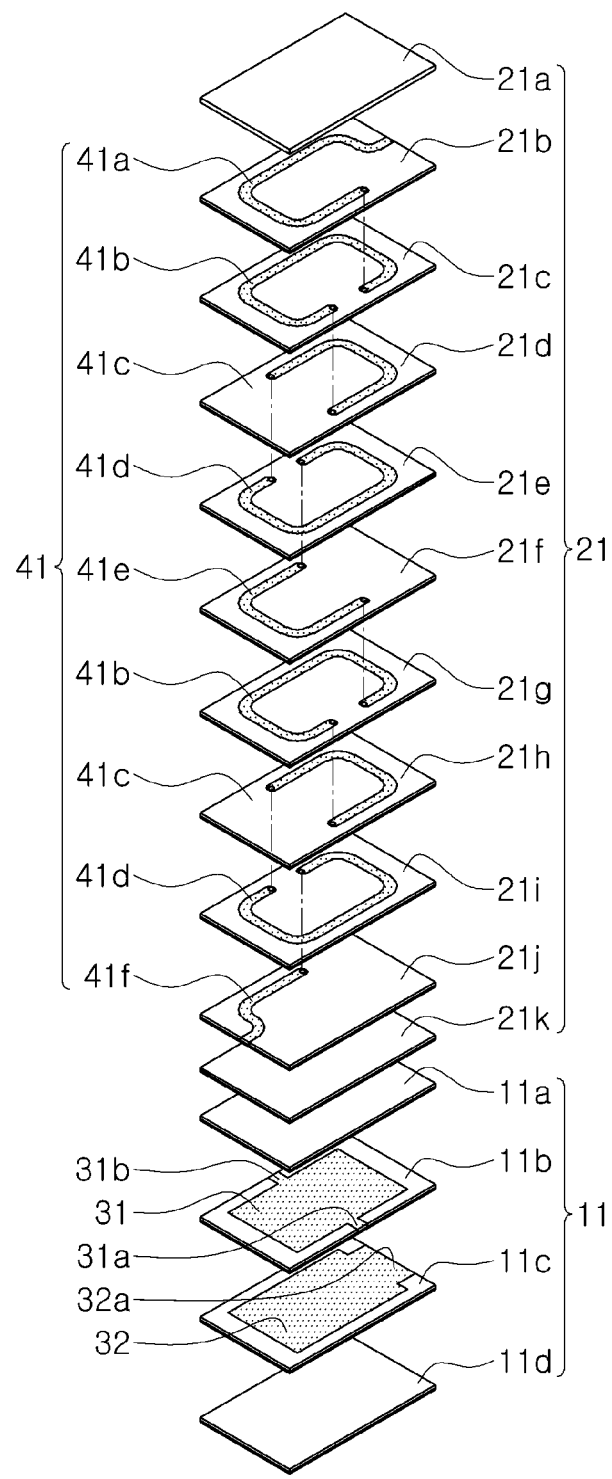
FIG. 12 is an exploded perspective view schematically illustrating a laminated configuration of the composite electronic component of FIG. 8 according to an exemplary embodiment of the present disclosure.

FIG. 12 is an exploded perspective view schematically illustrating a laminated configuration of the composite electronic component of FIG. 8 according to an exemplary embodiment of the present disclosure.

Figure 13:
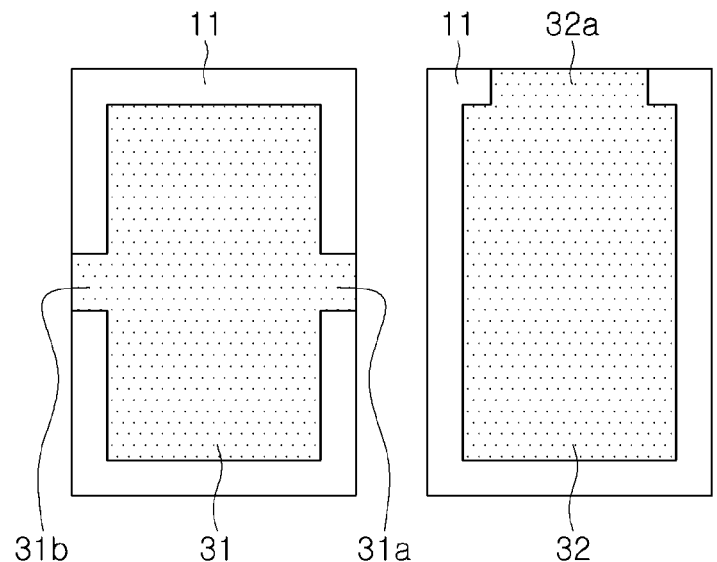
FIG. 13 is a plan view illustrating an internal electrode employable in a multilayer ceramic capacitor included in the composite electronic component illustrated in FIG. 8.

FIG. 13 is a plan view illustrating an internal electrode employable in a multilayer ceramic capacitor included in the composite electronic component illustrated in FIG. 8.

Referring to FIGS. 8 through 13, a composite electronic component 1 according to an exemplary embodiment of the present disclosure includes a composite body 30 including a capacitor 10 including a ceramic body in which a plurality of dielectric layers 11 and internal electrodes 31 and 32 are stacked such that the internal electrodes are disposed to face each other with the dielectric layer 11 interposed therebetween and an inductor 20 including a magnetic body including a coil part 40.

In the present exemplary embodiment, the composite body 30 has first and second main surfaces opposing one another, and first and second lateral surfaces and first and second end surfaces connecting the first and second main surfaces.

The composite body 30 may have a hexahedral shape as illustrated, but the present disclosure is not limited thereto.

The composite body 30 may be formed by combining the capacitor 10 and the inductor 20, and here, a method of forming the composite body 30 is not particularly limited.

For example, the composite body 30 may be formed by combining separately manufactured capacitor 10 and inductor 20 with a conductive adhesive, a resin, or the like, or by sequentially stacking the ceramic body of the capacitor 10 and the magnetic body of the inductor 20, without being particularly limited.

Meanwhile, in the present exemplary embodiment, the inductor 20 is disposed above the capacitor 10, but the present disclosure is not limited thereto and disposition of the inductor 20 and the capacitor 20 may vary.

Hereinafter, the capacitor 10 and the inductor constituting the composite body 30 will be described in detail.

According to the present exemplary embodiment, the magnetic body of the inductor 20 includes the coil part 40.

The inductor 20 may be, for example, a stacked-type inductor, a thin film-type inductor, or a winding-type inductor, without being particularly limited. In addition, a laser helixing-type inductor, or the like, may also be used.

The stacked-type inductor refers to an inductor manufactured by printing a thick electrode on a thin ferrite or glass ceramic sheet, stacking several layers of sheets with coil patterned printed thereon, and connecting internal conducting wires through via holes.

The thin film-type inductor refers to an inductor manufactured by forming coil conducting wires on a ceramic substrate through thin film sputtering or plating and filling it with a ferrite material.

The winding-type inductor refers to an inductor manufactured by winding a line material (coil conducting wire) around a core.

The laser helixing-type inductor refers to an inductor manufactured by forming an electrode layer on a ceramic bobbin through sputtering or plating, shaping a coil by laser helixing, and subsequently processing the coil into a terminal with an external protective film resin.

Referring to FIG. 9, in a composite electronic component according to a first exemplary embodiment of the present disclosure, the inductor 20 may be a stacked-type inductor.

In detail, the magnetic body may have a configuration in which a plurality of magnetic layers 21 each having a conductive pattern 41 formed thereon are stacked, and the conductive patterns 41 form the coil part 40.

Referring to FIG. 10, in a composite electronic component according to a second exemplary embodiment of the present disclosure, the inductor 20 may be a thin film-type inductor.

In detail, the inductor 20 may have a form of a thin film including an insulating substrate 23 and a coil formed on at least one surface of the insulating substrate 23.

The magnetic body may be formed by filling a magnet 22 in upper and lower portions of the insulating substrate 23 having the coil formed on at least one surface thereof.

Referring to FIG. 11, in a composite electronic component according to a third exemplary embodiment of the present disclosure, the inductor 20 may be a winding-type inductor.

In detail, the magnetic body of the inductor 20 includes a core 24 and a coil wound around the core 24.

Hereinafter, the case in which the inductor 20 is a stacked-type inductor according to the first exemplary embodiment, among the first to third exemplary embodiments, in the composite electronic component will be described in detail.

The magnetic body is manufactured by printing conductive patterns 41 on magnetic green sheets 21b to 21j, stacking the plurality of magnetic green sheets 21b to 21j with the conductive patterns 41 formed thereon, stacking magnetic green sheets 21a and 21k in upper and lower portions thereof, and subsequently sintering the resulting structure.

The magnet is formed of a Ni—Cu—Zn-based, Ni—Cu—Zn—Mg-based, Mn—Zn-based, or ferrite-based material, but the present disclosure is not limited thereto.

Referring to FIG. 12, after the conductive patterns 41 are printed on the magnetic green sheets 21b to 21j and dried, the magnetic green sheets 21a and 21k are stacked on the upper and lower portions thereof to form a magnetic body.

As for the conductive patterns 41 within the magnetic body, the plurality of conductive patterns 41a to 41f are stacked to form coil patterns in a stacking direction.

The conductive patterns 41 may be formed by printing a conductive paste including silver (Ag) as a main ingredient with a predetermined thickness.

The conductive patterns 41 are electrically connected to first and second input terminals 51 and 53 formed on both end portions in a length direction.

The conductive patterns 41 may have leads electrically connected to the first input and output terminals 51 and 53.

One conductive pattern 41a among the conductive patterns 41 is electrically connected to another conductive pattern 41b disposed with the magnetic layer 21 interposed therebetween through a via electrode formed on the magnet 21b, and has a coil pattern in the stacking direction.

In the exemplary embodiment of the present disclosure, the coil pattern is not particularly limited and may be designed according to capacity of the inductor.

Namely, the second to fifth conductive patterns 41b to 41e are stacked in a coil form between the first conductive pattern 41a having a lead exposed to a second end surface and the sixth conductive pattern 41f having a lead exposed to a first end surface, and the conductive patterns are connected by via electrodes formed on each magnet, respectively, as described above.

In FIG. 12, it is illustrated that the second to fifth conductive patterns 41b to 41e are repeated in pairs, but the present disclosure is not limited thereto and the number of the conductive patterns is not limited according to the purpose of the present disclosure.

Meanwhile, the ceramic body constituting the capacitor 10 is formed by stacking a plurality of dielectric layers 11a to 11d, and a plurality of internal electrodes 31 and 32 (first and second internal electrodes, sequentially) are separately disposed with the dielectric layer interposed therebetween within the ceramic body.

The dielectric layer 11 may be formed by sintering a ceramic green sheet including ceramic powder, an organic solvent, and an organic binder. The ceramic powder may be formed of a barium titanate ($BaTiO_3$)-based material, a strontium titanate ($SrTiO_3$)-based material as a material having a high permittivity (dielectric constant), but the present disclosure is not limited thereto.

Meanwhile, according to the exemplary embodiment of the present disclosure, the internal electrodes may include the first internal electrode 31 having leads 31a and 31b exposed to one or more of first and second lateral surfaces of the composite body 30 and the second internal electrode 32 having a lead 32a exposed to the second end surface, but the present disclosure is not limited thereto.

In detail, the ceramic body constituting the capacitor 10 is formed by stacking the plurality of dielectric layers 11a to 11d.

The first and second internal electrodes 31 and 32 are formed on a portion of dielectric layers 11b and 11c, among the plurality of dielectric layers 11a to 11d, so as to be stacked.

According to the exemplary embodiment of the present disclosure, the first and second internal electrodes 31 and 32 are formed of a conductive paste including a conductive metal, but the present disclosure is not limited thereto.

The conductive metal may be a nickel (Ni), copper (Cu), palladium (Pd), or alloys thereof, but the present disclosure is not limited thereto.

The first and second internal electrodes 31 and 32 may be formed by printing a conductive paste on each ceramic green sheet forming the dielectric layer 11 through a printing method such as a screen printing method or a gravure printing method.

The ceramic green sheets with the internal electrodes printed thereon may be alternately stacked and sintered to form the ceramic body.

In FIG. 13, pattern shapes of the first and second internal electrodes 31 and 32 are illustrated, but the present disclosure is not limited thereto and the pattern shapes of the first and second internal electrodes 31 and 32 may be variously modified.

The capacitor serves to adjust a voltage supplied from the power management unit (or the PMIC).

The composite electronic component 1 according to the exemplary embodiment of the present disclosure includes an input terminal 51 formed on the first end surface of the composite body 30 and connected to the coil part 40 of the inductor 20; an output terminal 52 formed on the second end surface of the composite body 30 and connected to the coil part 40 of the inductor 20 and the second internal electrode 32 of the capacitor 10; and a ground terminal 53 formed on one or more of upper and lower surfaces and the first and second lateral surfaces of the composite body 30 and connected to the first internal electrode 31 of the capacitor 10.

The input terminal 51 and the output terminal 52 are connected to the coil part 40 of the inductor 20 to serve as an inductor within the composite electronic component.

Also, the output terminal 52 is connected to the second internal electrode 32 of the capacitor 10, and the first internal electrode 31 of the capacitor 10 is connected to the ground terminal 53 to serve as the capacitor within the composite electronic component.

The input terminal 51, the output terminal 52, and the ground terminal 53 are formed of a conductive paste including a conductive metal.

The conductive metal may be nickel (Ni), copper (Cu), tin (Sn), or alloys thereof, but the present disclosure is not limited thereto.

The conductive paste may further include an insulating material, and here, the insulating material may be, for example, glass, but the present disclosure is not limited thereto.

A method of forming the input terminal 51, the output terminal 52, and the ground terminal 53 is not particularly limited. Namely, the input terminal 51, the output terminal 52, and the ground terminal 53 may be formed by dipping the ceramic body, or by using any other method such as plating, or the like.

In the composite electronic component according to another exemplary embodiment of the present disclosure, the inductor 20 suppresses an AC component of supplied power, and the capacitor 10 reduces ripples in supplied power.

Figure 14:
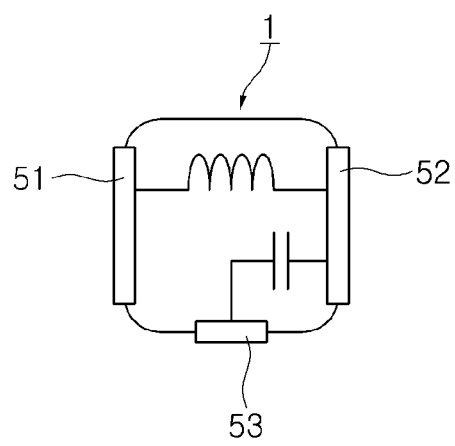
FIG. 14 is an equivalent circuit diagram of the composite electronic component illustrated in FIG. 8.

FIG. 14 is an equivalent circuit diagram of the composite electronic component illustrated in FIG. 8.

Referring to FIG. 14, the inductor 20 and the capacitor 10 are connected in series as the input terminal 51, the output terminal 52, and the ground terminal 53 are connected to respective components.

Unlike the related art, in the composite electronic component according to the exemplary embodiment of the present disclosure, since the inductor 20 and the capacitor 10 are combined, the inductor 20 and the capacitor 10 may be designed to have a shortest distance therebetween, thus reducing noise.

In addition, since the inductor 20 and the capacitor 10 are combined, a mounting area in the power management unit may be minimized, advantageously securing a mounting space.

Also, mounting costs may be reduced.

A ratio (output power/input power) of output power to input power input to the composite body may be greater than or equal to 85%.

In the composite body, a frequency of input/output power may range from 1 MHz to 30 MHz.

The capacitor may have capacitance ranging from 1 µF to 100 µF.

The inductor may have inductance ranging from 0.01 µH to 1.1 µH.

A volume ratio (volume of magnet/volume of composite body) of the magnet to the overall volume of the composite body may range from 55% to 95%.

The input terminal may be formed in a portion of the first end surface of the composite body.

A current of power input to or output from the composite body may range from 0.1 A to 10.0 A.

Figure 15:
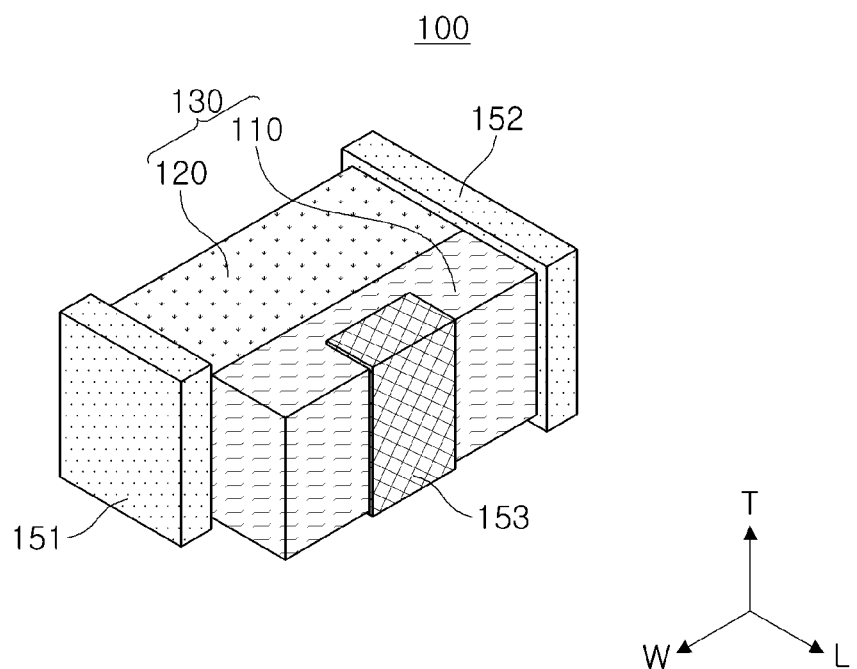
FIG. 15 is a perspective view schematically illustrating a composite electronic component according to another exemplary embodiment of the present disclosure.

FIG. 15 is a perspective view schematically illustrating a composite electronic component according to another exemplary embodiment of the present disclosure.

Referring to FIG. 15, a composite electronic component according to another exemplary embodiment of the present disclosure includes a hexahedral composite 130, and the composite 130 may be formed by combining a capacitor 110 and an inductor 120. The capacitor 110 is disposed on a lateral surface of the inductor 120.

The composite electronic component according to another exemplary embodiment of the present disclosure has characteristics identical to those of the composite electronic component 1 according to the exemplary embodiment of the present disclosure as described above, except that the capacitor 110 is disposed on both lateral surfaces of the inductor 120, so a detailed description thereof will be omitted.

Meanwhile, the composite electronic component according to another exemplary embodiment of the present disclosure, as a power smoothing electronic component used in a power source terminal of a portable mobile device, suppressing an AC component of supplied power, and reducing ripples, includes: a power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part, the capacitor and the inductor being integrally combined; an input terminal formed on one end surface of the power smoothing unit and receiving power which has been converted by a power management unit; and an output terminal formed on one end surface of the power smoothing unit and supplying power which has been smoothed by the power smoothing unit, wherein the inductor may suppress an AC component of the supplied power and the capacitor may reduce ripples in the supplied power.

Table 1 displays results of determining DC-bias characteristics, DC resistance (Rdc), ripple reduction characteristics according to a volume ratio (volume of magnet/volume of composite electronic component) of the magnet to the overall volume of the composite electronic component.

The test was conducted on a composite electronic component including an inductor having inductance equal to 0.47 µH and a capacitor having capacitance equal to 22 µF were combined, and here, the test was conducted while changing the ratio of the volume of the magnet of the inductor to the overall volume of the composite electronic component.

The inductor having inductance equal to 0.47 µH and the capacitor having capacitance equal to 22 µF refer to an inductor having lowest inductance and a capacitor having highest capacitance used in a mobile device.

Namely, the test was conducted on the composite electronic component under the harshest conditions possible, which may not be surpassed even if inductance of an inductor is minimized and capacitance of a capacitor is maximized.

The DC-bias characteristics were set to allow total inductance to be approximately 70% of a design value when a current equal to or more than a predetermined current is applied to the inductor, and an inductance value under the level was determined as being defective.

Namely, in the present exemplary embodiment, an inductor having inductance equal to 0.47 µH was used, and a case in which an inductance value equal to or less than 0.329 µH, equivalent to 70%, was determined as being defective.

When the DC resistance Rdc is equal or more than 50 mΩ, efficiency was degraded to below 85%, which is not appropriate to be used in a mobile device, and thus, a case in which DC resistance Rdc was equal to or more than 50 mΩ wad determined as being defective.

The ripple reduction characteristics were determined according to Vp-p (peak to peak) measurement results, and a case in which Vp-p was equal to or more than 10% over a reference voltage was determined as being defective.

TABLE 1

| Sample | Volume ratio of magnet | DC-Bias characteristics (3A applied) (µH) | Rdc (mΩ) | Determination of ripple |
|---|---|---|---|---|
| *1 | 45 | 0.19 | 55 | ○ |
| *2 | 50 | 0.25 | 50 | ○ |
| 3 | 55 | 0.33 | 44 | ○ |
| 4 | 60 | 0.37 | 42 | ○ |
| 5 | 65 | 0.43 | 40 | ○ |
| 6 | 70 | 0.47 | 38 | ○ |
| 7 | 80 | 0.48 | 35 | ○ |
| 8 | 90 | 0.49 | 33 | ○ |
| 9 | 95 | 0.49 | 32 | ○ |

TABLE 1-continued

| Sample | Volume ratio of magnet | DC-Bias characteristics (3A applied) (μH) | Rdc (mΩ) | Determination of ripple |
|---|---|---|---|---|
| *10 | 96 | 0.49 | 32 | x |

*Comparative Example

Referring to Table 1, it can be seen that samples 1 and 2 had a volume ratio (volume of magnet/volume of composite electronic component) to the overall volume of the composite electronic component, less than 55%, respectively, in which DC-bias characteristics were less than 0.329 μH, equivalent to 70% of 0.47 μH, being defective, and the DC resistance (Rdc) was equal to or more than 50 mΩ, being defective.

Also, it can be seen that sample 10 had a volume ratio (volume of magnet/volume of composite electronic component) to the overall volume of the composite electronic component, exceeding 95%, in which ripple reduction characteristics are defective.

In contrast, it can be seen that samples 3 to 9 had a volume ratio (volume of magnet/volume of composite electronic component) to the overall volume of the composite electronic component, ranging from 55% to 95% as a numeral value range according to the exemplary embodiment of the present disclosure, respectively, in which the DC-bias characteristics, the DC resistance (Rdc), and the ripple reduction characteristics are excellent.

Board Having Composite Electronic Component Mounted Thereon

Figure 16:
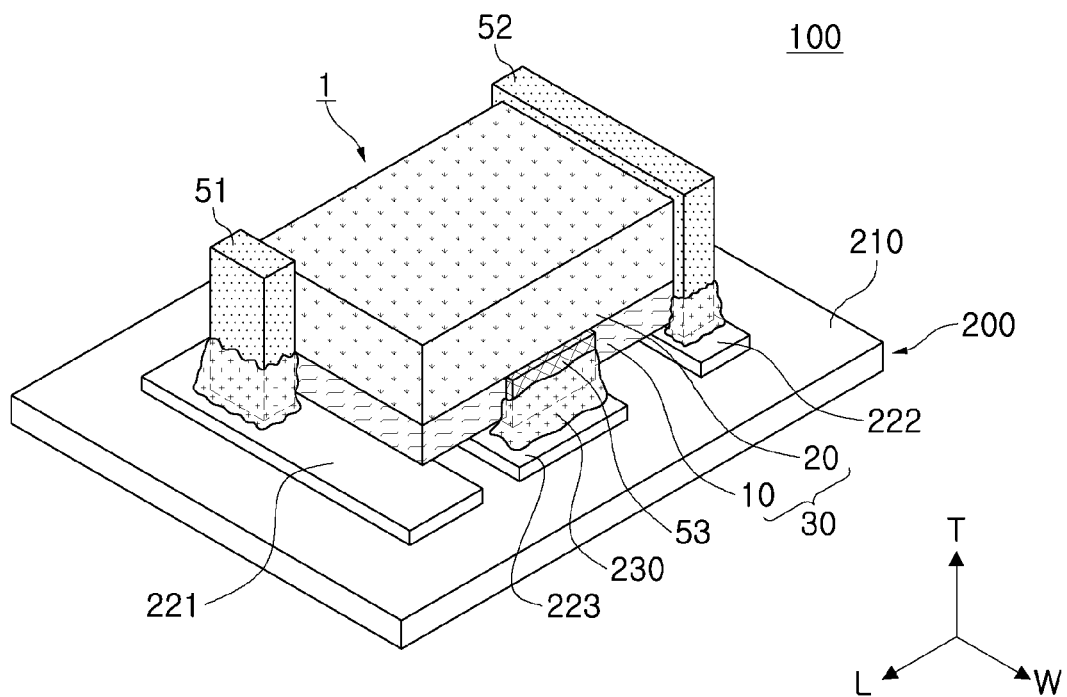
FIG. 16 is a perspective view illustrating the composite electronic component of FIG. 8 mounted on a printed circuit board.

FIG. 16 is a perspective view illustrating the composite electronic component of FIG. 8 mounted on a printed circuit board.

Referring to FIG. 16, a mounting board 200 for mounting the composite electronic component 1 according to the exemplary embodiment of the present disclosure includes a printed circuit board (PCB) 210 on which the composite electronic component 1 is mounted and three or more electrode pads 221, 222, and 223 formed on an upper surface of the PCB 210.

The electrode pads include first to third electrode pads 221, 222, and 223 connected to an input terminal 51, an output terminal 52, and a ground terminal 53, respectively, of the composite electronic component 1.

Here, in a state in which the input terminal 51, the output terminal 52, and the ground terminal 53 of the composite electronic component 1 are positioned to be in contact with the first to third electrode pads 221, 222, and 223, the composite electronic component 1 may be electrically connected to the PCB 210 by solders 230.

Power Smoothing Unit

A power smoothing unit including a composite electronic component according to another exemplary embodiment of the present disclosure includes a battery; a first power smoothing unit smoothing power supplied from the battery; a power management unit receiving converted power from the first power smoothing unit and having a plurality of DC/DC converters and switching elements; and a second power smoothing unit receiving converted power from the power management unit and smoothing the received power, wherein the second power smoothing unit is a composite electronic component including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, wherein the inductor suppresses an alternating current (AC) component of the supplied power and the capacitor reduces ripples in the supplied power.

As set forth above, according to exemplary embodiments of the present disclosure, a composite electronic component capable of reducing an area for mounting components in a driving power supply system may be provided.

Also, a composite electronic component capable of suppressing generation of noise in a driving power supply system may be provided.

While exemplary embodiments have been shown and described above, it will be apparent to those skilled in the art that modifications and variations could be made without departing from the spirit and scope of the present disclosure as defined by the appended claims.

What is claimed is:

1. A composite electronic component comprising:
an input terminal configured to receive input power which has been converted by a power management unit;
a power smoothing unit that smooths the input power, the power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, the inductor connected between the input terminal and the capacitor; and
an output terminal configured to output the smoothed input power,
wherein the inductor suppresses voltage fluctuations of the input power and the capacitor reduces ripples in the input power.

2. The composite electronic component of claim 1, wherein a ratio of the output power to the input power (output power/input power) is equal to or greater than 85%.

3. The composite electronic component of claim 1, wherein a frequency of the input power or the output power ranges from 1 MHz to 30 MHz.

4. The composite electronic component of claim 1, wherein capacitance of the capacitor ranges from 1 μF to 100 μF.

5. The composite electronic component of claim 1, wherein inductance of the inductor ranges from 0.01 μH to 1.1 μH.

6. The composite electronic component of claim 1, wherein a volume ratio of the magnet to the overall volume of the composite electronic component (volume of magnet/volume of composite electronic component) ranges from 55% to 95%.

7. The composite electronic component of claim 1, wherein the input terminal is formed in a portion of one end surface of the power smoothing unit.

8. The composite electronic component of claim 1, wherein a current of the input power or the output power ranges from 0.1 A to 10.0 A.

9. The composite electronic component of claim 1, wherein the composite electronic component comprises a ground terminal unit connecting the power smoothing unit and a ground.

10. A composite electronic component comprising:
a composite body including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, the capacitor and the inductor being integrally combined;

an input terminal disposed on a first end surface of the composite body and connected to a conductive pattern of the inductor;

an output terminal disposed on a second end surface of the composite body and connected to the conductive pattern of the inductor and an internal electrode of the capacitor; and a ground terminal disposed on one or more of upper and lower surfaces and first and second lateral surfaces of the composite body and connected to the internal electrode of the capacitor, wherein the inductor and the capacitor are connected in series between the input terminal and the capacitor, the inductor suppresses voltage fluctuations of input power, and the capacitor reduces ripples in the input power.

11. The composite electronic component of claim 10, wherein the magnetic body is formed by stacking a plurality of magnetic layers each having a conductive pattern formed thereon, and the conductive patterns constitute the coil part.

12. The composite electronic component of claim 10, wherein the inductor is a thin film-type inductor in which the magnetic body includes an insulating substrate and a coil formed in at least one surface of the insulating substrate.

13. The composite electronic component of claim 10, wherein the magnetic body comprises a core and a winding coil wound around the core.

14. The composite electronic component of claim 10, wherein a ratio (output power/input power) of output power to input power input to the composite body is equal to or greater than 85%.

15. The composite electronic component of claim 10, wherein a frequency of the input power or output power from the composite body ranges from 1 MHz to 30 MHz.

16. The composite electronic component of claim 10, wherein capacitance of the capacitor ranges from 1 µF to 100 µF.

17. The composite electronic component of claim 10, wherein inductance of the inductor ranges from 0.01 µH to 1.1 µH.

18. The composite electronic component of claim 10, wherein a volume ratio of the magnet to the overall volume of the composite body (volume of magnet/volume of composite electronic component) ranges from 55% to 95%.

19. The composite electronic component of claim 10, wherein the input terminal is formed in a portion of one end surface of the composite body.

20. The composite electronic component of claim 10, wherein a current of power input to or output from the composite body ranges from 0.1 A to 10.0 A.

21. The composite electronic component of claim 10, wherein the internal electrode comprises a first internal electrode having a lead exposed to one or more of the first and second lateral surfaces of the composite body and a second internal electrode having a lead exposed to the second end surface of the composite body.

22. The composite electronic component of claim 10, wherein the inductor is disposed on an upper portion of the capacitor.

23. The composite electronic component of claim 10, wherein the capacitor is disposed on a lateral surface of the inductor.

24. A composite electronic component, as a power smoothing electronic component used in a power source terminal of a portable mobile device, suppressing voltage fluctuations of input power, and reducing ripples, the composite electronic component comprising:

a power smoothing unit including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, the capacitor and the inductor being integrally combined;

an input terminal disposed on one end surface of the power smoothing unit and receiving the input power which has been converted by a power management unit; and an output terminal disposed on one end surface of the power smoothing unit and outputting output power which has been smoothed by the power smoothing unit, wherein the inductor, connected between the input terminal and the capacitor, suppresses voltage fluctuations of the input power and the capacitor reduces ripples in the input power.

25. A power smoothing unit comprising:

a battery;

a first power smoothing unit smoothing power supplied from the battery;

a power management unit converting power provided from the first power smoothing unit through a switching operation; and a second power smoothing unit smoothing input power provided from the power management unit, wherein the second power smoothing unit is a composite electronic component including a capacitor including a ceramic body in which a plurality of dielectric layers and internal electrodes are stacked such that the internal electrodes are disposed to face each other with the dielectric layer interposed therebetween and an inductor including a magnetic body including a coil part and a magnet, wherein the inductor, connected between the input terminal and the capacitor, suppresses voltage fluctuations of the input power and the capacitor reduces ripples in the input power.

26. The power smoothing unit of claim 25, wherein the power management unit comprises:

a transformer in which primary and secondary sides are insulated from one another;

a switch unit positioned in the primary side of the transformer and switching power provided from the first power smoothing unit;

a pulse width modulation (PWM) integrated circuit (IC) controlling a switching operation of the switch unit; and a rectifying unit positioned in the secondary side of the transformer and rectifying the converted power.

* * * * *